United States Patent [19]
Waho

[11] Patent Number: 5,280,182
[45] Date of Patent: Jan. 18, 1994

[54] RESONANT TUNNELING TRANSISTOR WITH BARRIER LAYERS

[75] Inventor: Takao Waho, Kanagawa, Japan

[73] Assignee: Nippon Telegraph and Telephone Corporation, Kanagawa, Japan

[21] Appl. No.: 871,148

[22] Filed: Apr. 20, 1992

[30] Foreign Application Priority Data

Apr. 22, 1991 [JP] Japan ............................. 3-118066
Nov. 13, 1991 [JP] Japan ............................. 3-324109

[51] Int. Cl.$^5$ .............................................. H01L 29/88
[52] U.S. Cl. ...................................... 257/25; 257/29; 257/197; 257/592
[58] Field of Search .................... 257/25, 197, 29, 592

[56] References Cited

U.S. PATENT DOCUMENTS

| 4,849,799 | 7/1989 | Capasso et al. | 257/25 |
| 4,958,201 | 9/1990 | Mimura | 357/16 |
| 4,959,696 | 9/1990 | Frensley et al. | 357/16 |
| 5,017,973 | 5/1991 | Mizuta et al. | 357/4 |
| 5,049,955 | 9/1991 | Freeouf et al. | 257/29 X |
| 5,059,545 | 10/1991 | Frensley et al. | 437/31 |

FOREIGN PATENT DOCUMENTS

| 52-105785 | 9/1977 | Japan . |
| 61-216467 | 9/1986 | Japan . |
| 1-251662 | 10/1989 | Japan | 257/25 |

OTHER PUBLICATIONS

Reed et al., "Realization of a Three-Terminal Resonant Tunneling Device: The Bipolar Quantum Resonant Tunneling Transistor," *Appl. Phys. Lett,* 54(11), 13 Mar. 1989, pp. 1034-1036.

Capasso (Ed.), *Physics of Quantum Electron Devices,* 1990, pp. 202-211, Springer-Verlag, New York.

Primary Examiner—William Mintel
Attorney, Agent, or Firm—Townsend and Townsend Khourie and Crew

[57] ABSTRACT

According to this invention, a resonant tunneling transistor includes a first semiconductor layer having an n-type conductivity and serving as a collector layer, a second semiconductor layer having a p-type conductivity and serving as a base layer, a third semiconductor layer having the n-type conductivity and serving as an emitter layer, a fourth semiconductor layer serving as a first barrier layer against either of electrons and holes in the first and second semiconductor layers, and a fifth semiconductor layer serving as a second barrier layer against either of electrons and holes in the second and third semiconductor layers. The first, second, third, fourth, and fifth semiconductor layers are sequentially stacked in an order of the first, fourth, second, fifth, and third semiconductor layers. The second semiconductor layer sandwiches at least one sixth semiconductor layer serving as a third barrier against either of electrons and holes, thereby dividing the second semiconductor layer into a plurality of semiconductor layer portions.

10 Claims, 12 Drawing Sheets

RESONANT TUNNELING TRANSISTOR WITH BARRIER LAYERS

BACKGROUND OF THE INVENTION

The present invention relates to a resonant tunneling transistor used in a super high-speed element and a functional element.

A resonant tunneling phenomenon is known as a super high-speed phenomenon of 1 ps or less, and a resonant tunneling diode having an oscillation frequency of more than 600 GHz and using a negative resistance has already been reported. In addition, a resonant tunneling transistor obtained by directly adding the third electrode for controlling the resonance phenomenon to a resonant tunneling barrier structure has also been examined. The present invention relates to the latter resonant tunneling transistor.

FIG. 1 shows a typical arrangement of a conventional resonant tunneling transistor. The resonant tunneling transistor shown in FIG. 1 is arranged as follows. That is, on an n-type GaAs crystal semiconductor substrate 21, a semiconductor layer 22 consisting of n-type GaAs and serving as a collector layer, a semiconductor layer 23 serving as a first barrier layer against either of electrons and holes and consisting of, e.g., AlGaAs, a quantum well layer 24 serving as a base layer and consisting of GaAs doped with a p-type impurity, a semiconductor layer 25 serving as a second barrier layer against either of electrons and holes and consisting of, e.g., AlGaAs, and a semiconductor layer 26 serving as an emitter and consisting of n-type GaAs are sequentially grown by a normal molecular beam epitaxial method (MBE method) so as to form a collector electrode 27 and an emitter electrode 28 respectively connected to the semiconductor substrate 21 and the semiconductor layer 26. In addition, the semiconductor layer 26 is partially removed by etching to form a base electrode 29 connected to the quantum well layer 24.

FIGS. 2 and 3 show band structures corresponding to the stacked structure consisting of the collector layer 22 and the emitter layer 26. A power supply is connected between the collector electrode 27 and the emitter electrode 28 through a load such that the positive terminal of the power supply is connected to the collector electrode, and a bias voltage $V_{BE}$ is applied across the base electrode 29 and the emitter electrode 28 such that the base electrode is positive. When the bias voltage $V_{BE}$ is gradually increased, a Fermi level can be changed from the state in FIG. 2 to the state in FIG. 3. In these drawings, reference numeral 31 denotes a conduction band minimum; and 32, a valence band maximum. Reference symbol $E_f^E$ denotes a Fermi level of an emitter layer; and $E_f^B$, a Fermi level of a base layer. Reference numeral 33 denotes a ground-state energy level of electrons in the quantum well layer 24; 34, a first excited-state level of the electrons in the quantum well layer 24; 35, a ground-state energy level of heavy holes in the quantum well layer 24; 36, an excited-state level of the heavy holes in the quantum well layer 24; 37, an ground-state energy level of light holes in the quantum well layer 24; 38, a first excited-state level of the light holes in the quantum well layer 24; and 39, a depletion layer formed in the emitter layer.

When the voltage $V_{BE}$ is increased to cause the ground-state energy level 33 to be lower than the Fermi level $E_f^E$ of the emitter layer 26, electrons are injected from the emitter layer 26 into the base layer 24 by resonant tunneling. At this time, since most of the electrons flow into the collector, an amplifying operation similar to a normal bipolar transistor is obtained, thereby flowing a collector current Ic.

When the bias voltage is further increased, the ground-state energy level 33 becomes lower than the conduction band minimum of the emitter layer, thereby suppressing resonant tunneling.

When the bias voltage is further increased, the first excited-state level 34 becomes lower than the Fermi level $E_f^E$ of the emitter layer, and electrons are injected from the emitter layer 26 into the base layer 24 by resonant tunneling. Since most of the electrons flow into the collector layer 22, a collector current is increased again. When the bias voltage is further increased, the first excited-state level 34 becomes lower than the conduction band minimum of the emitter layer 26 to suppress resonant tunneling, thereby decreasing the collector current.

As a result, as shown in FIG. 4, characteristics in which an emitter-collector current $I_C$ is periodically changed, i.e., $I_{P1}$, $I_{V1}$, $I_{P2}$, and $I_{V2}$, in accordance with an increase in emitter-base voltage $V_{BE}$ can be realized. Therefore, the resonant tunneling transistor having the above characteristics is examined to be used as a functional element having the functions of a parity generating circuit, a multi-value logical circuit, a multi-value memory circuit, an A/D converting circuit, and an oscillating element (Literature: F. Cappaso, Ed., "Physics of Quantum Electron Devices", Spring-Verlag, Berlin, Heidelberg, 1990).

The resonant tunneling transistor with the above arrangement, however, has the following various problems.

In a bias state in which resonant tunneling of electrons occurs, holes, especially light holes, flow from the base layer 24 to the emitter layer 26 through the second barrier layer 25 due to a tunneling phenomenon. This current corresponds to a forward current of a p-n junction, and the current is sharply increased in accordance with an increase in bias voltage. For this reason, an emitter injection efficiency is considerably decreased to disadvantageously decrease an amplification factor. In addition, when the resonant tunneling current of electrons is sharply increased, this current is canceled by the tunneling current of holes. Therefore, the negative transconductance disadvantageously disappears.

FIG. 5 shows the current-voltage characteristics of the emitter and base. In FIG. 5, a characteristic curve a represents a case wherein electrons in the emitter layer 26 are injected in the base layer 24 and holes in the base layer 24 are injected in the emitter layer 26, and a characteristic curve b represents a case wherein only electrons in the emitter layer 26 are injected in the base layer 24.

In order to solve the above problem, Frensley et al. proposed the following (Japanese Patent Application No. 62-111469: U.S. Ser. No. 07/768542, U.S. Ser. No. 07/825720). That is, a semiconductor having the energy gap of the forbidden band larger than that of the base layer 24 is used as an emitter (wide-gap emitter) layer 26' to cause band discontinuity between the emitter layer 26' and the base layer 24. An example of this proposal is shown in FIG. 6. In FIG. 6, reference symbols $\Delta E_C$ and $\Delta E_V$ denote band discontinuity values of a conduction band and a valence band, respectively. When a bias voltage is applied in an operative state, the band discontinuity value $\Delta E_V$ prevents holes located in the base layer 24 from flowing in the emitter region 26'. This method is similar to a known method for increasing an emitter injection efficiency by a hetero-junction bipolar transistor.

In this structure, however, to be described below, since the value $\Delta E_C$ necessarily generated with the value $\Delta E_V$ limits a level in the quantum well used for resonant tunneling of electrons to an excited-state level, another problem is posed as follows. That is, in resonant tunneling using an excited-state level, compared with resonant tunneling using a ground-state energy level, a ratio of a resonant tunneling current component to a non-resonant tunneling current component, i.e., a so-called peak-to-valley ratio (P/V ratio) is decreased. Although a detailed mechanism of the structure is not yet clarified, many experimental results pointing out this fact have been conventionally reported. Since the negative transconductance of the structure corresponds to the P/V ratio, an essential problem, i.e., a negative transconductance in such a resonant tunneling three-terminal element using an excited-state level, is posed.

The second problem posed when an excited-state level is used is a distortion of an output waveform. When electrons injected in the excited-state level flow into a collector layer, the electrons flow along two paths. The first path is a path in which the electrons are directly tunneled to the collector layer 22, and the second path is a path in which the electrons are once de-excited to a normal state by scattering of electrons in the base layer 24 and then tunneled to the collector layer 22. Tunneling times along the two paths are largely different from each other because the heights of the tunneling barriers of the two paths are different by a difference between the excited-state level and the ground-state energy level. For this reason, after a collector current flows along the first path, a collector current flows along the second path with a time lag. Therefore, the output current waveform is disadvantageously distorted.

Still another problem posed when an AlAs/GaAs hetero-junction is used together with the excited-state level will be described below. Since the effective mass (0.082 $m_e$ or less) of light holes of GaAs is substantially equal to the effective mass (0.067 $m_e$) of electrons, the energies of the levels 33 and 37 in the quantum well are substantially equal to each other when the energies are measured from the bottom of the well. On the other hand, since it is known that the difference in the energy gap of a forbidden band is distributed to the discontinuity values of a conduction band and a valence band at a ratio of about 60:40, the value $\Delta E_C$ which is 1.5 times the value $\Delta E_V$ is generated For this reason, when tunneling of holes is prevented by the value $\Delta E_V$, the value $\Delta E_C$ larger than the ground state of electrons is necessarily formed. For this reason, in a bias state wherein the ground-state energy level 33 is equal to the conduction band minimum of the emitter layer 26, the thickness of the barrier layer is actually increased due to a depletion layer on the emitter side, and a large resonant tunneling current is not obtained. Therefore, in order to obtain an actual resonant current, a bias voltage required for eliminating the depletion layer on the emitter side must be applied to cause resonance with the excited-state level so as to supply an emitter current.

In the above description, the AlAs/GaAs hetero-junction is used. However, even when a hetero-junction of other Group III–V compound semiconductors is used, the distribution state of band discontinuity and a relationship between electrons and light holes are not largely changed. For this reason, it is very difficult to solve the above problems by changing the materials.

As another method of suppressing holes from flowing into the emitter layer 26, the concentration of light holes in the base layer 24 is decreased. In a quantum well, the level of light holes is higher than that of heavy holes. For this reason, all the holes can serve as heavy holes by decreasing a Fermi level. However, in this method, the hole concentration has an upper limit, and a base resistance is disadvantageously increased. The base resistance is an important factor for defining the high-frequency operation of an element. More specifically, it is apparent from the analogy of a bipolar transistor that a maximum oscillation frequency $f_{max}$ is considerably decreased.

As another method of rising the ground-state energy level of light holes compared with the Fermi level in the quantum well layer 24, there is a method using a structure in which the width of the quantum layer 24 is decreased. However, in this structure, since a p-type impurity doped in the base layer is necessarily diffused in the emitter layer, an emitter injection efficiency is decreased, and a current gain is decreased. In addition, a negative transconductance disadvantageously decreased or disappears.

As described above, in the conventionally proposed structures, a large negative transconductance and a decrease in distortion of an output waveform cannot be realized without an increase in base resistance.

SUMMARY OF THE INVENTION

It is a principal object of the present invention to provide a resonant tunneling transistor in which a current gain can be increased compared with that of a conventional transistor and a negative transconductance can be increased.

It is another object of the present invention to provide a resonant tunneling transistor in which the distortion of an output current waveform is improved.

It is still another object of the present invention to provide a resonant tunneling transistor in which an increase in base resistance is suppressed and high-frequency characteristics are improved.

It is still another object of the present invention to provide a resonant tunneling transistor in which variations in peak value of a resonant tunneling current are suppressed to improve element characteristics.

It is still another object of the present invention to provide a resonant tunneling transistor in which a switching operation is performed at a speed higher than that of a conventional transistor.

In order to achieve the above objects, according to an aspect of the present invention, there is provided a resonant tunneling transistor comprising a first semiconductor layer having an n-type conductivity and serving as a collector layer, a second semiconductor layer having a p-type conductivity and serving as a base layer, a third semiconductor layer having the n-type conductivity and serving as an emitter layer, a fourth semiconductor layer serving as a first barrier layer against either of electrons and holes in the first and second semiconductor layers, and a fifth semiconductor layer serving as a second barrier layer against either of electrons and holes in the second and third semiconductor layers, wherein the first, second, third, fourth, and fifth semiconductor layers are sequentially stacked in an order of the first, fourth, second, fifth, and third semiconductor layers, and the second semiconductor layer sandwiches a sixth semiconductor layer serving as a third barrier against either of electrons and holes, thereby dividing the second semiconductor layer into a plurality of semiconductor layer portions.

DESCRIPTION OF THE PREFERRED EMBODIMENTS

Figure 1:
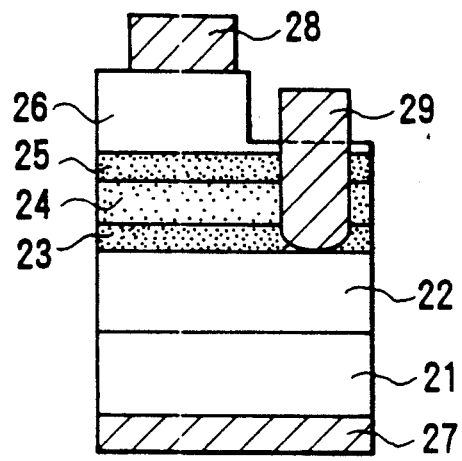
FIG. 1 is view showing a typical arrangement of a conventional resonant tunneling transistor.
Figure 2:
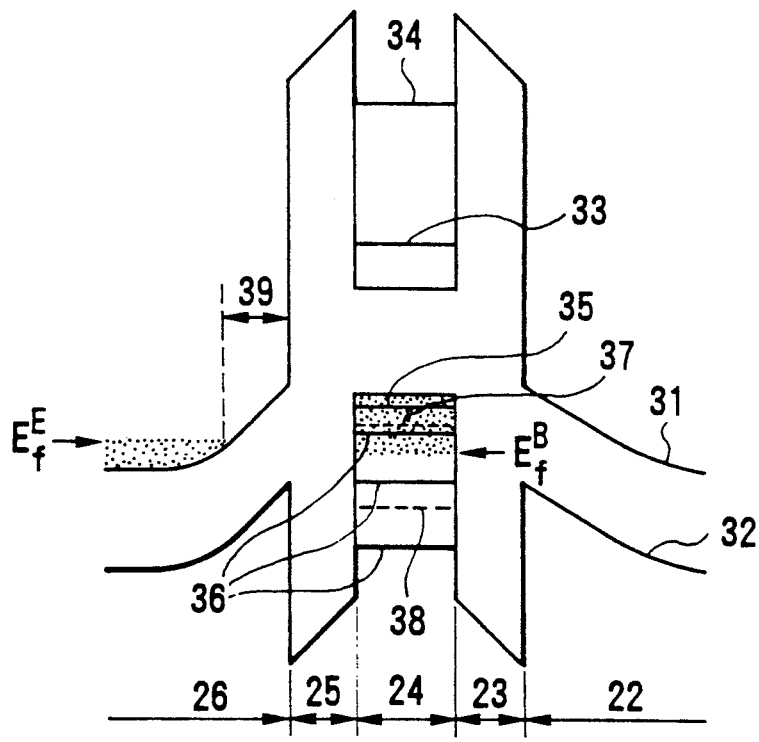
FIG. 2 is a view showing a band structure of the transistor shown in FIG. 1.
Figure 3:
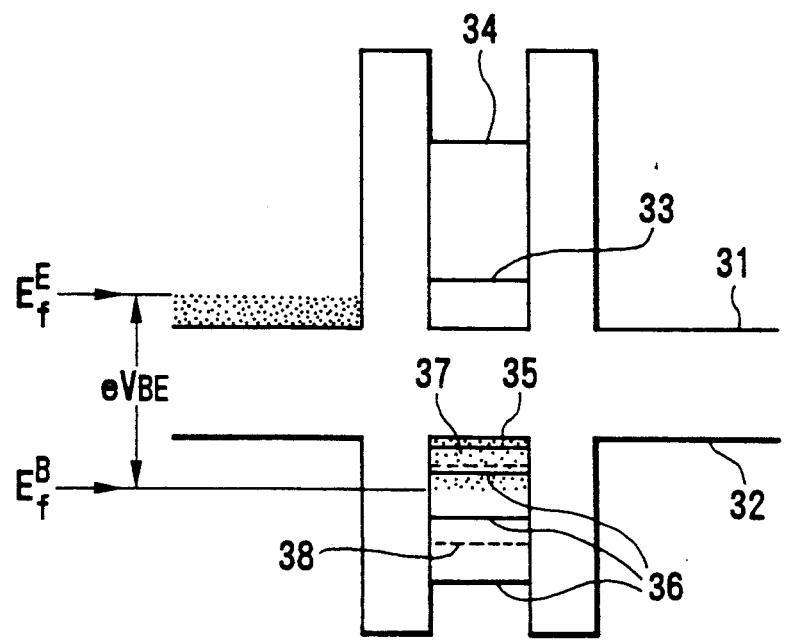
FIG. 3 is a view showing a band structure obtained by changing a voltage $V_{BE}$ in the band structure in FIG. 2.
Figure 4:
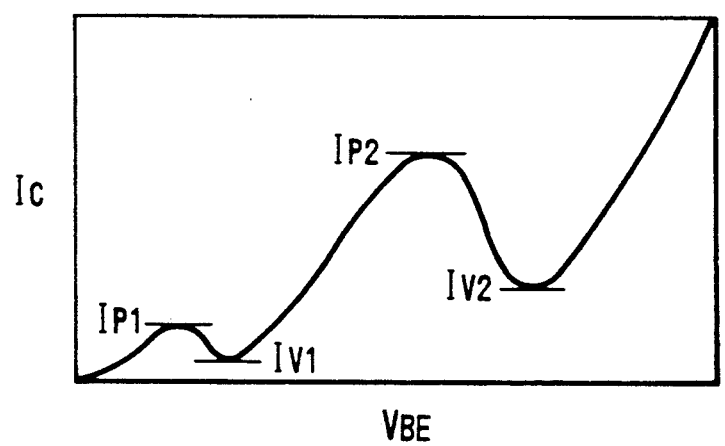
FIG. 4 is a graph showing $V_{BE}$-$I_C$ characteristics of the conventional resonant tunneling transistor.
Figure 5:
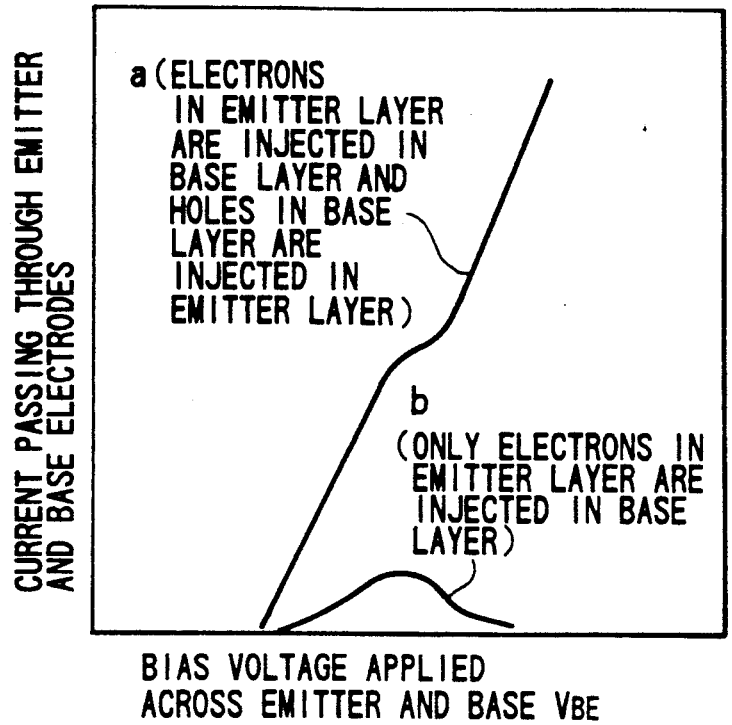
FIG. 5 is a graph showing base-emitter current characteristics in accordance with a change in a voltage $V_{BE}$ of the conventional resonant tunneling transistor.
Figure 6:
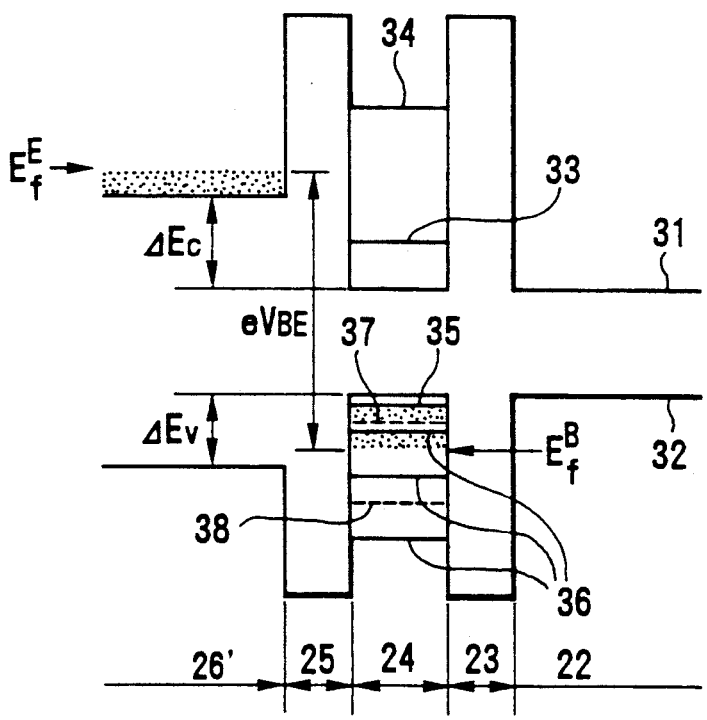
FIG. 6 is a view showing a band structure for explaining an operation of the conventional resonant tunneling transistor.
Figure 7:
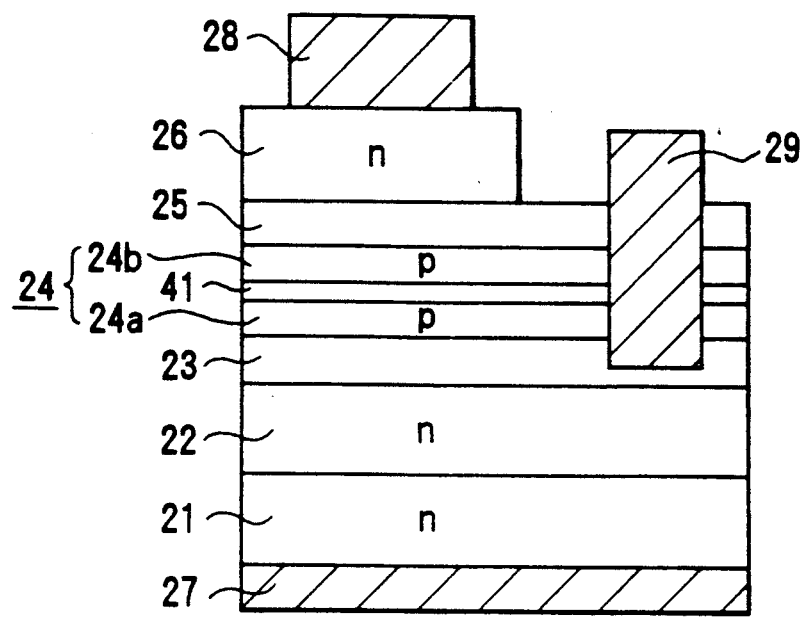
FIG. 7 is a resonant tunneling transistor according to an embodiment of the present invention.

FIG. 7 shows a resonant tunneling transistor according to an embodiment of the present invention, and the reference numerals as in FIG. 1 denote the same parts in FIG. 7.

In FIG. 7, the following points are different from FIG. 1. That is, in a quantum well layer 24 serving as a base, a semiconductor layer 41 consisting of un-doped AlAs is sandwiched as an intermediate barrier layer against either of electrons and holes. As a result, the quantum well layer 24 is divided into semiconductor layer portions 24a and 24b. The thicknesses of the semiconductor layer portions 24a and 24b are substantially equal to each other. Although the concentration distribution of a p-type impurity in each of the layer portions may be uniform, the concentration distribution is preferably set such that the p-type impurity is gradually decreased in the outer direction from the center of each of the layer portions.

The above structure is obtained by sequentially growing the layers by a normal molecular beam epitaxial growth method as in the conventional technique. In the quantum well layers 24a and 24b each having the above p-type impurity concentration distribution, the growth of a semiconductor layer (in this embodiment, GaAs layer) is temporarily stopped at the center portion in a thickness direction, and a p-type impurity (e.g., Be) is planarly doped. Note that an emitter electrode 28, a base electrode 29, and a collector electrode 27 may be formed by a normal GaAs process technique.

Figure 8:
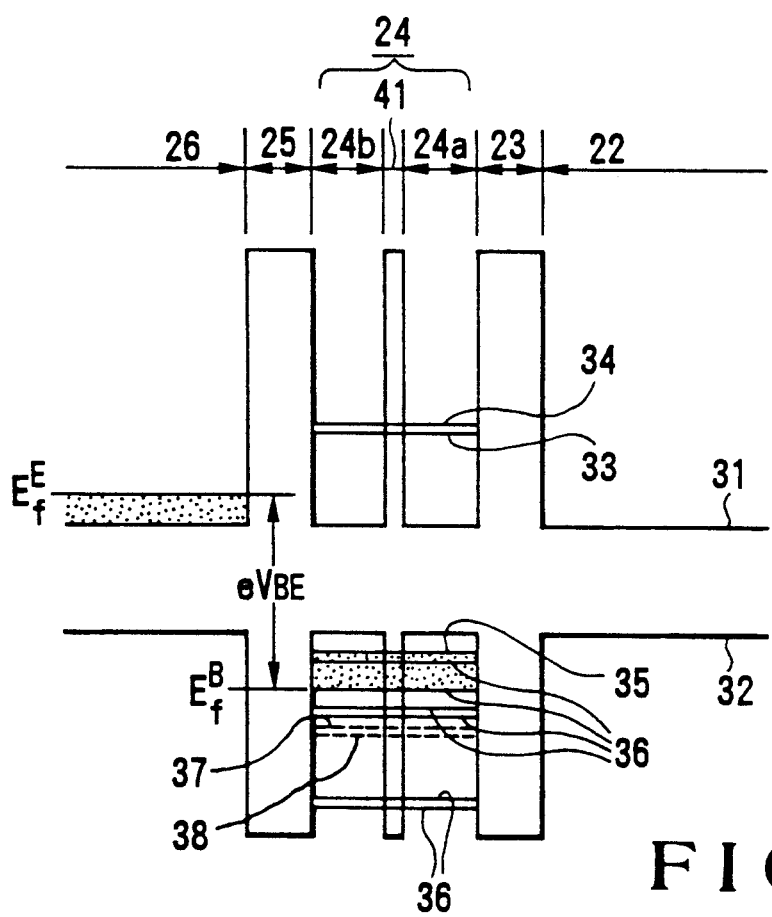
FIG. 8 is a view showing a band structure for explaining an operation of the transistor in FIG. 7 wherein a bias voltage $V_{BE}$ close to a voltage in an operative state is applied across the emitter and the base.

The band structure of the resonant tunneling transistor formed as described above is shown in FIG. 8.

Figure 9:
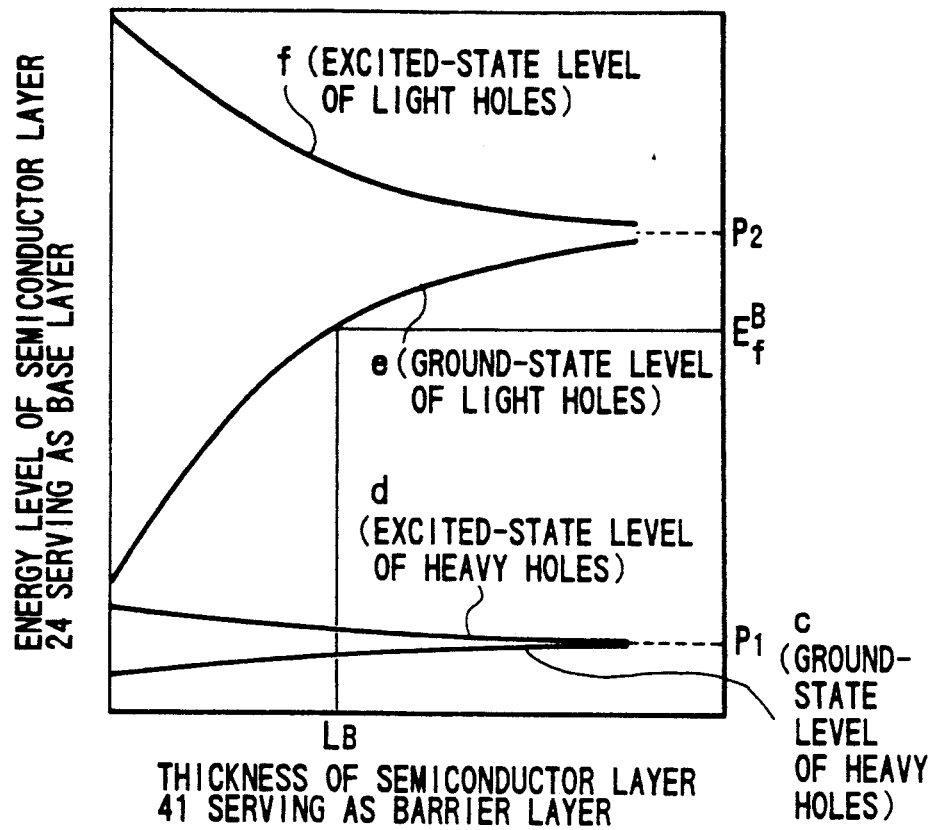
FIG. 9 is a graph showing energy levels of heavy and light holes as a function of the layer width of an intermediate layer in the embodiment of FIG. 7.

In the above structure, since the quantum well layer 24 serving as a base layer is constituted by the semiconductor layer 41 serving as an intermediate barrier layer (e.g., AlAs) serving a barrier against either of electrons and holes of a semiconductor such as GaAs and the two quantum well thin layers 24a and 24b separated from each other by the insertion of the semiconductor layer 41, the levels of all the electrons and holes in the quantum well layer 24 serving as the base layer are determined by quantum mechanical coupling of these layers. The levels are calculated by the Schrödinger equation. These energy levels are shown in FIG. 9 as a function of the layer width of the intermediate barrier layer. The levels are generated such that, when two quantum wells are quantum-mechanically bonded to each other, the level inherent to the quantum well is separated into two close levels. In FIG. 9, characteristic curves c and d represent the ground-state energy level and first excited-state level of heavy holes, and characteristic curves e and f represent the ground-state energy level and the first excited-state level of light holes. When the thickness of the semiconductor layer 41 serving as the intermediate barrier layer is increased, as shown in FIG. 9, the characteristic curves c and d are asymptotic to the same value P1, and the characteristic curve e and f are asymptotic to the same value P2. These values P1 and P2 are the energy levels of heavy holes and light holes in independent quantum wells having the same well widths as those of the quantum well thin layers 24a and 24b. As indicated by the characteristic curve e in FIG. 9, the ground-state energy level of the light holes is characterized in that the ground-state energy level sharply increased by increasing the intermediate barrier layer width becomes asymptotic to the value P2. For this reason, as shown in FIG. 9, the layer width of the semiconductor layer 41 serving as the intermediate barrier layer is set to be larger than a value at an intersection the Fermi level $E_f^\beta$ of the base layer and the characteristic curve e, so that all the holes in the base layer can serve as heavy holes.

In the base structure, since there are two levels of heavy holes, holes twice those of a conventional single quantum well base layer can be stored. That is, since the state density of a two-dimensional hole gas is $D = em^x/\pi\hbar^2$, holes of $(E_f^\beta - E_{hh}^0) \times D$ can be stored in a conventional structure, and holes of $(E_f^\beta - E_{hh}^0) \times D + (E_f^\beta - E_{hh}^1) \times D$ being nearly equal to $2 \times (E_f^\beta - E_{hh}^0) \times D$ can be stored in the structure of this embodiment. In this case, $E_{hh}^0$ and $E_{hh}^1$ represent energy values of the ground-state energy level (characteristic curve c) and the first excited-state level (characteristic curve b) of the heavy holes, respectively.

Figure 10:
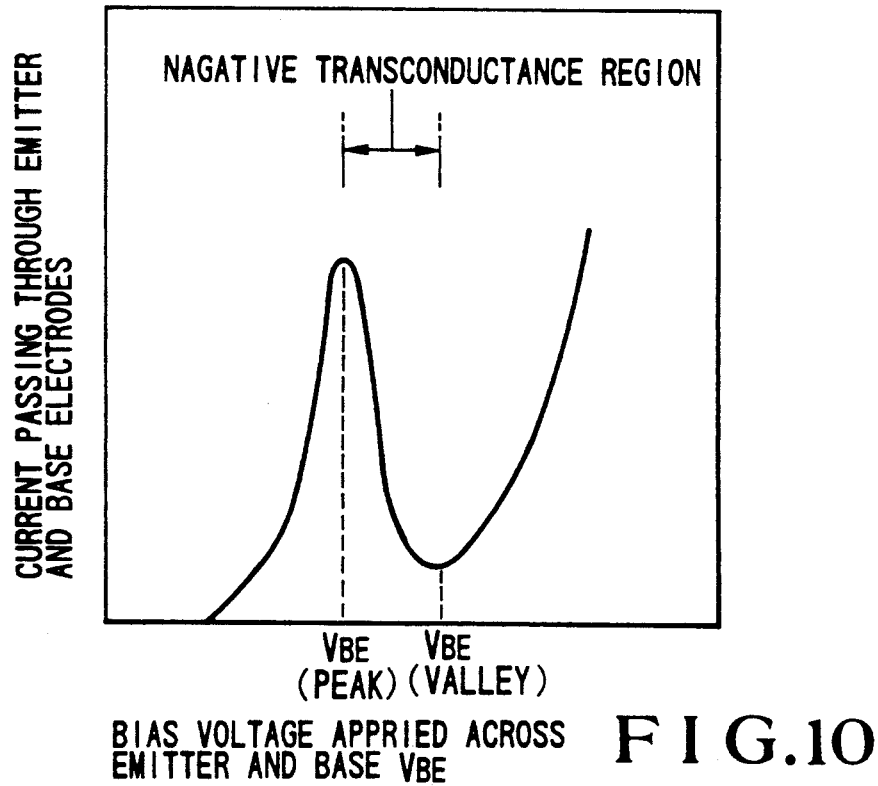
FIG. 10 is a graph showing voltage-current characteristics between the emitter and base of the element in the embodiment of FIG. 7.

In practice, in this embodiment, each of the quantum well thin layers 24a and 24b consists of 5-nm GaAs, and the semiconductor layer 41 serving as the intermediate barrier layer consists of 1.2-nm AlAs. For this reason, both of the ground-state energy level and the first excited-state level of the heavy holes are about 25 meV, and the ground-state energy level and the first excited-state level of the light holes are 92 meV and 122 meV, respectively. In addition, since a Be dose is $3 \times 10^{13}$ cm$^{-2}$, the Fermi level is 85 meV. Since this level is lower than the ground-state energy level of the light holes, all the holes serve as heavy holes. Even when the transistor is biased in an operative state shown in FIG. 8, tunnel injection into the emitter region is considerably smaller than injection of electrons into the base region. As a result, as emitter-base voltage-current characteristics, preferable resonant tunneling characteristics having a large P/V ratio can be obtained as shown in FIG. 10.

Figure 11:
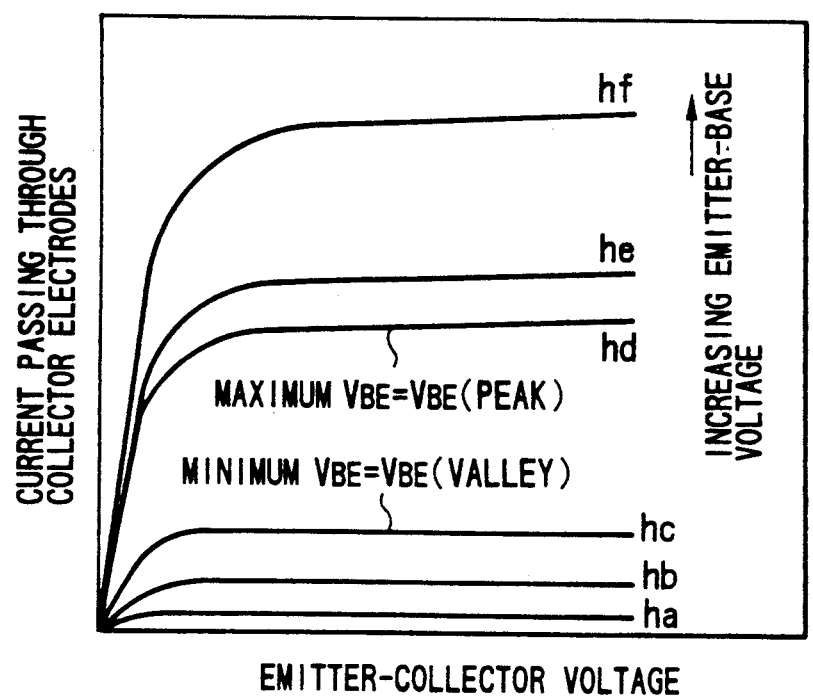
FIG. 11 is a graph showing common emitter output characteristics of the element in the embodiment of FIG. 7.
Figure 12:
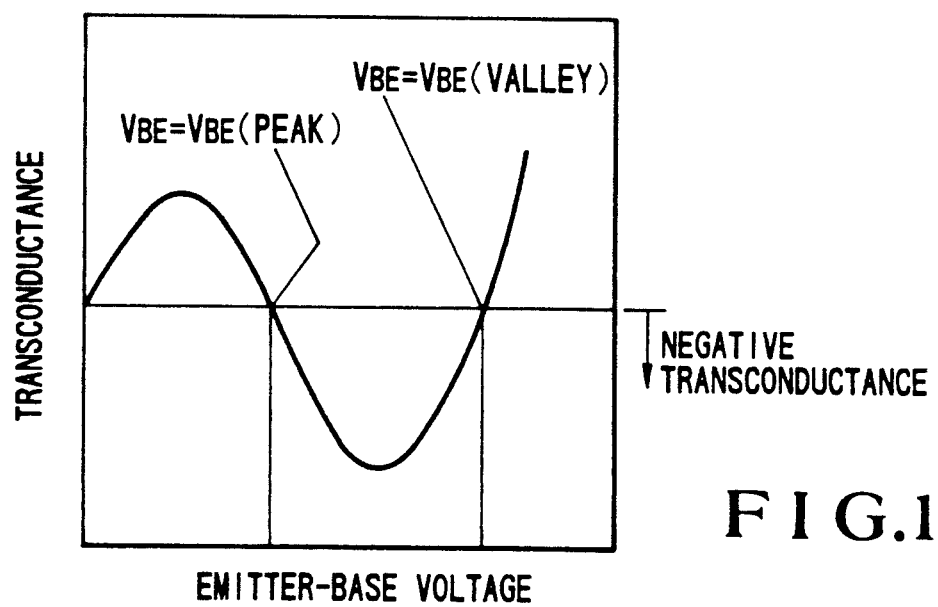
FIG. 12 is a graph showing a negative transconductance of the element in the embodiment of FIG. 7.

The common emitter output characteristics of the element of this embodiment is shown in FIG. 11. In accordance with an increase in emitter-base voltage, ha, hb, hd, hc, he, hf and current-voltage characteristics are changed. More specifically, when the emitter-base voltage is changed from a peak voltage $V_{BE}$ (peak) to a valley voltage $V_{BE}$ (valley) as in FIG. 10, output characteristics are changed from hd to hc, and as shown in FIG. 12, a large negative transconductance can be obtained. Even when a base current is used in place of the emitter-base voltage, the same negative transconductance can be obtained.

Figure 13:
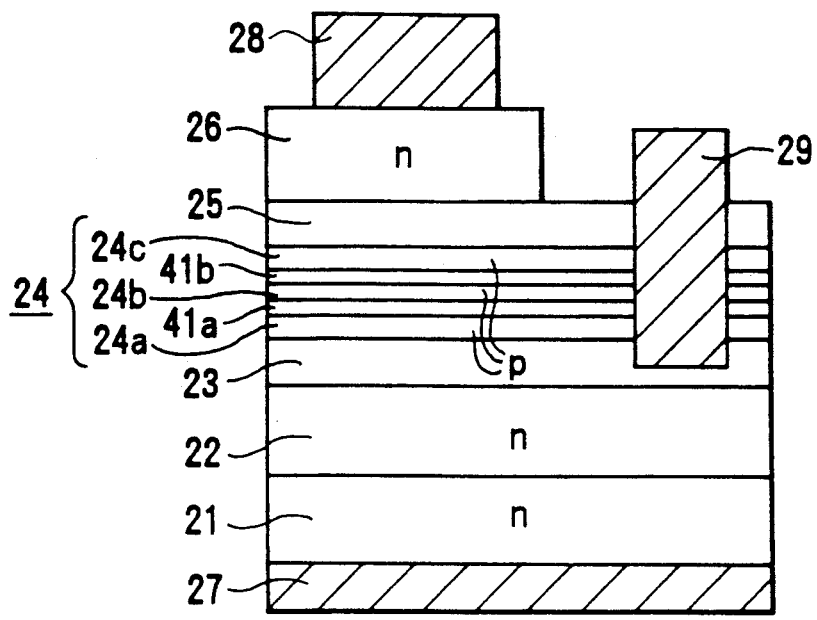
FIG. 13 is a view showing an arrangement of a transistor according to the second embodiment of the present invention.
Figure 14:
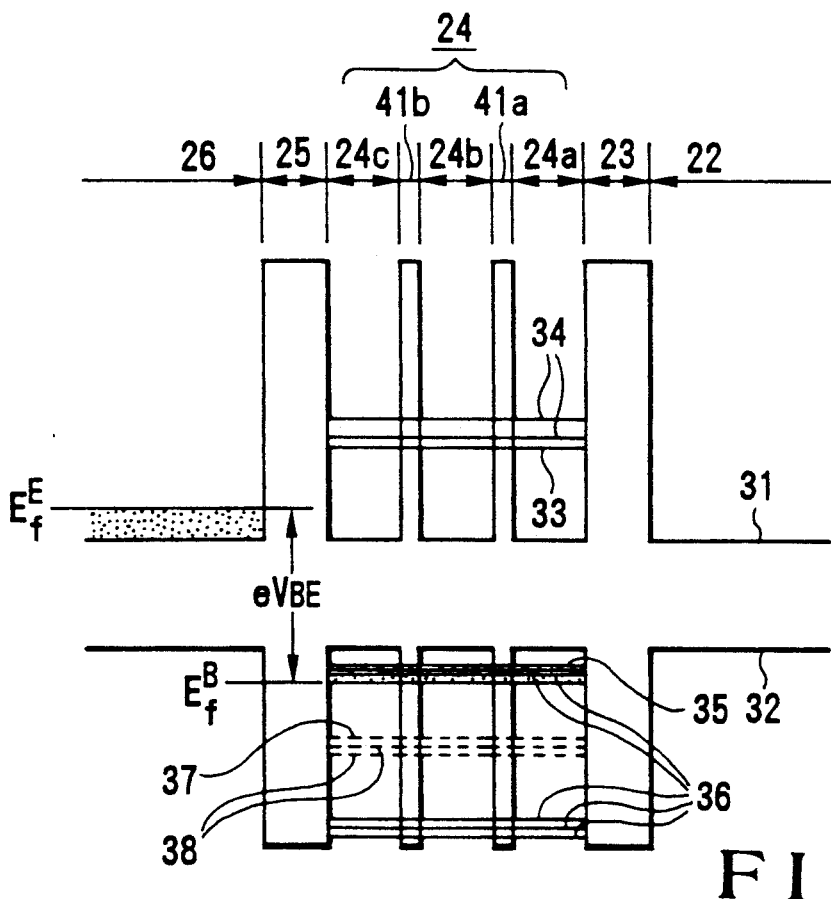
FIG. 14 is a view showing a band structure wherein a bias voltage $V_{BE}$ close to a voltage in an operative state is applied across the base and emitter of the transistor in FIG. 13.

The second embodiment of the present invention will be described below with reference to FIGS. 13 and 14. The overall structure of the element of the embodiment is similar to the element of the first embodiment shown in FIGS. 7 and 8 except for a base layer. FIG. 13 shows a basic arrangement of a resonant tunneling transistor according to the present invention, and FIG. 14 shows the band structure in the element structure according to the present invention. A bias voltage $V_{BE}$ close to a voltage in an operative state is applied across the emitter and base of the element. In FIG. 14, reference numerals 22, 23, 25 and 26 denote an n-type GAAs collector layer, an AlAs first barrier layer, an AlAs second barrier layer, and an n-type GaAs layer emitter layer. The same reference numerals as in FIGS. 7 and 8 denote the same parts in FIG. 14. Reference numeral 24 denotes a base layer, and the reference numerals 24a, 24b, and 24c denote GaAs quantum well thin layers. Reference numerals 41a and 41b denote AlAs intermediate barrier layers. In addition, reference numerals 31 and 32 denote a conduction band minimum and a valence band maximum, respectively. Reference symbols $E_f^E$ and $E_f^\beta$ denote the Fermi levels of emitter and base regions, respectively. Reference numerals 33 and 34 denote the ground-state energy level and excited-state level of electrons in the base layer 24, reference numerals 35 and 36 denote the ground-state energy level and excited-state level of heavy holes in the base layer, and reference numerals 37 and 38 denote the ground-state energy level and excited-state level of light holes in the base layer 24. Reference symbol $eV_{BE}$ denotes a potential difference between the emitter and the base.

As in the first embodiment, the element structure of the second embodiment is formed by a normal molecular beam epitaxial growth method and a GaAs process technique.

Figure 15:
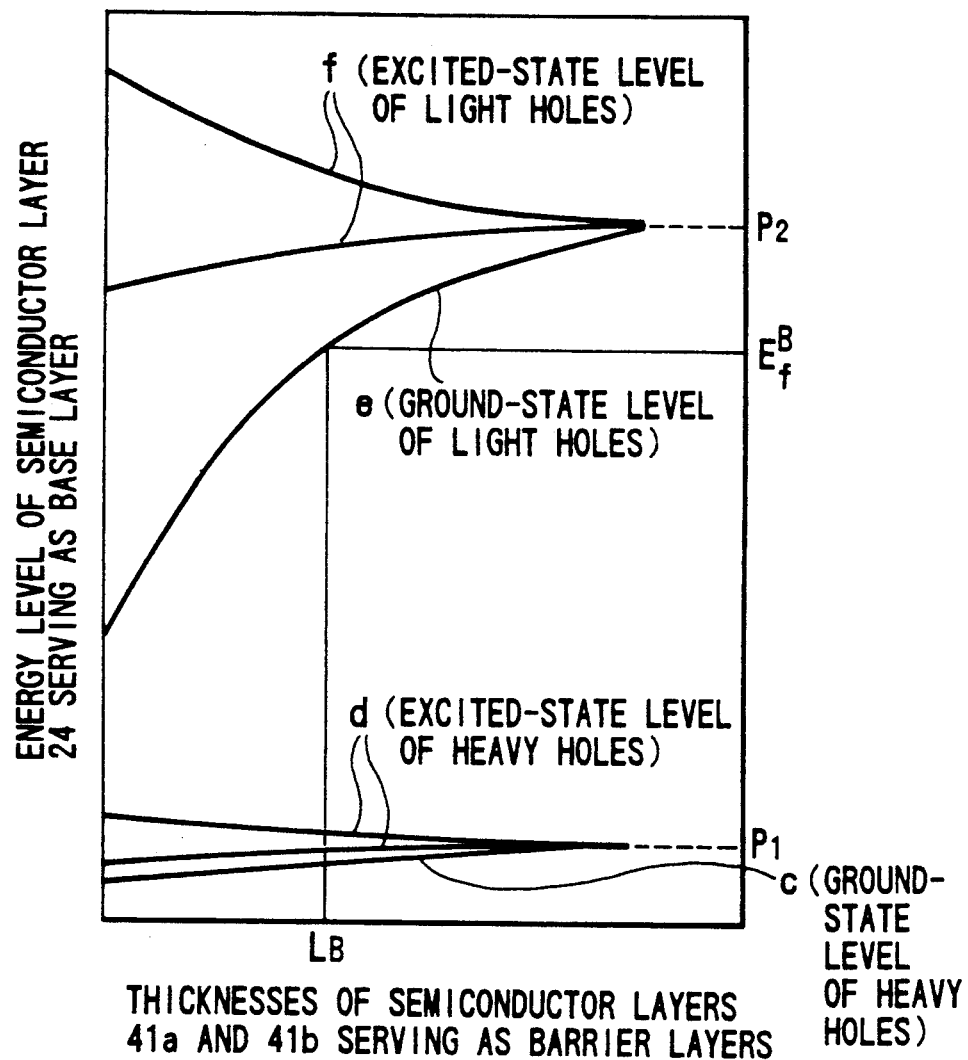
FIG. 15 is a graph showing energy levels of heavy and light holes as a function of the layer width of an intermediate layer in the embodiment of FIG. 13.

In this structure, the base layer 24 is constituted by the two AlAs intermediate barrier layers 41a and 41b having the same thickness and serving as barriers against either of electrons and holes of GaAs and three GaAs quantum well thin layers 24a, 24b and 24c equally divided by the intermediate barrier layers 41a and 41b. For this reason, the levels of electrons and holes in the entire base layer are determined by the quantum mechanical coupling of these layers. These energy levels are shown in FIG. 15 as a function of the layer widths of the intermediate barrier layers. In FIG. 15, characteristic curves c and d represent the ground-state energy level and excited-state level of heavy holes, and characteristic curves e and f represent the ground-state energy level and excited-state level of light holes, respectively. When the thicknesses of the intermediate barrier layers are increased, as shown in FIG. 15, the characteristic curves c and d are asymptotic to the same value P1, and the characteristic curve e and f are asymptotic to the value P2. These values P1 and P2 are the energy levels of heavy holes and light holes in independent quantum well having the same well widths as those of the quantum well thin layers 24a, 24b, and 24c. As shown in FIG. 15, the ground-state energy level 37 of the light holes indicated by the characteristic curve e is sharply increased and asymptotic to the value P2. For this reason, as in the first embodiment, the layer widths of the semiconductor layers 41a and 41b serving as the intermediate barrier layers are set to be larger than a value at an intersection between the Fermi level $E_f^\beta$ of the base layer and the characteristic curve e, so that all the holes in the base layer can serve as heavy holes.

In addition, in the above base structure, since there are three levels of heavy holes, holes three times those of a conventional single quantum well base layer can be stored. That is, since the state density of a two-dimensional hole gas is $D = em^x/\pi\hbar^2$, holes of $(E_f^\beta - E_{hh}^0) \times D$ can be stored in a conventional structure, and holes of $(E_f^\beta - E_{hh}^0) \times D + (E_f^\beta - E_{hh}^1) \times D$ being nearly equal to $3 \times (E_f^\beta - E_{hh}^0) \times D$ can be stored in the structure of this embodiment. In this case, $E_{hh}^0$, $E_{hh}^1$, and $E_{hh}^2$ represent energy values of the ground-state energy level (characteristic curve c) and the excited-state level (characteristic curve b) of the heavy holes.

In practice, in this embodiment, each of the quantum well thin layers consists of 5-nm GaAs, and each of the intermediate barrier layers consists of 1-nm AlAs. For this reason, both of the ground-state energy level and excited-state level of the heavy holes are about 22 meV, and the ground-state energy level and excited-state level of the light holes are 86 meV and 116 meV, respectively. In addition, since a Be dose is $3\times 10^{13}$ cm$^{-2}$, the Fermi level is 62 meV. Since this level is lower than the ground-state energy level of the light holes, all the holes serve as heavy holes. Even when the transistor is biased in an operative state shown in FIG. 14, tunnel injection into the emitter region is considerably smaller than injection of electrons into the base region. As a result, as emitter-base voltage-current characteristics, preferable resonant tunneling characteristics having a large P/V ratio and similar to that shown in FIG. 10 can be obtained. According to this, a large negative transconductance can be obtained as in the first embodiment.

Figure 16:
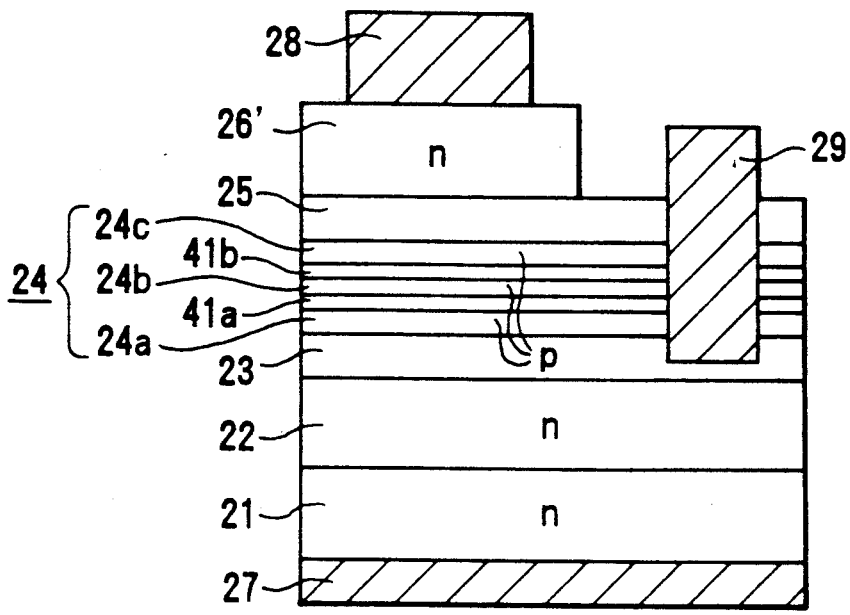
FIG. 16 is a view showing an arrangement of a transistor according to the third embodiment of the present invention.
Figure 17:
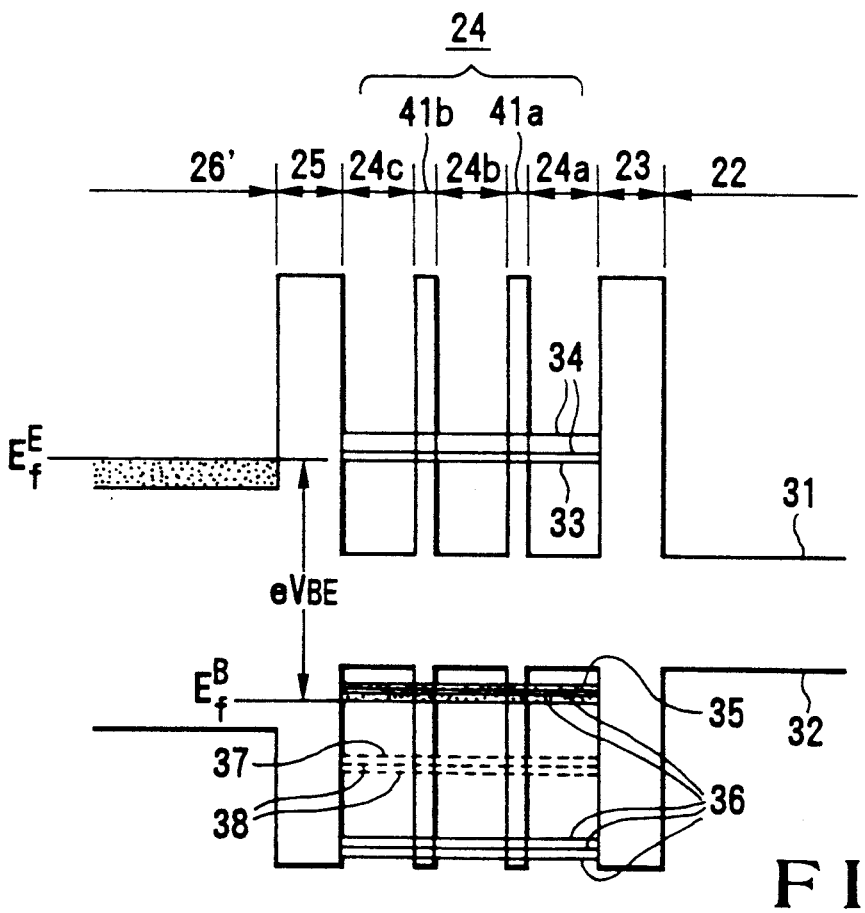
FIG. 17 is a view showing only a conduction band minimum of a band structure in the embodiment of FIG. 16.

The third embodiment shown in FIGS. 16 and 17 will be described below.

This embodiment has the same structure as that of the second embodiment except for an emitter layer and the dose of planar doping of Be in a base layer. This embodiment is characterized in that an emitter layer 26' consists of AlGaAs having an Al composition ratio of 0.1. For this reason, the band discontinuity values of a conduction band minimum 31 and a valence band maximum 32 are obtained as 75 meV and 50 meV, respectively. The ground-state energy level of electrons in a base layer 24 is 114 meV. Since this value is larger than the band discontinuity value of the conduction band minimum 31, a resonant tunneling current using this ground-state level can be used as an emitter-collector current. In addition, since the dose of Be planar doping in the base layer 24 is set to be $2\times 10^{13}$ cm$^{-2}$, the Fermi level in the base layer 24 becomes 48 meV, and all the holes serve as heavy holes. Furthermore, since the value of the Fermi level $E_f^\beta$ is smaller than the band discontinuity value $\Delta E_V$ of the valence band maximum, tunnel injection of the heavy holes into the emitter layer 26' is suppressed, and a negative transconductance is further increased.

In the above first to third embodiments, AlGaAs/GaAs structures are exemplified. However, even when the present invention is applied to a resonant tunneling barrier structure having an InGaAs/GaAs pseudo morphic structure or the like, the same effect as described above can be obtained.

As described above, according to the present invention, since a quantum well layer serving as the base layer of a conventional resonant tunneling transistor consists of a plurality of quantum wells which are quantum-mechanically coupled to each other, holes in a base region can be stored using only a plurality of heavy holes. For this reason, light holes which are easily tunnel-injected into an emitter layer are not present, and an emitter injection efficiency is remarkably increased. Therefore, a negative transconductance unique to resonant tunneling can be increased, and a base resistance can be decreased.

Furthermore, since the ground-state energy level of electrons in the base layer rises, even when the emitter layer consists of a semiconductor material having a large energy gap of a forbidden band, the ground-state energy level can be used for resonant tunneling, thereby obtaining a large negative transconductance. In addition, it is apparent that an effect of a decrease in output waveform distortion can be obtained.

The fourth embodiment of the present invention will be described below with reference to FIGS. 18 and 19.

The overall structure of a resonant tunneling transistor according to this embodiment is similar to that of a conventional transistor shown in FIG. 1 except for a base layer. This embodiment is characterized by the structure of this base layer. FIG. 19 shows only a conduction band minimum of a band structure in the resonant tunneling transistor according to the present invention, and FIG. 19 shows a case wherein a bias voltage $V_{BE}$ close to a voltage in an operative state is applied across the emitter and base of the transistor. In these drawings, a semiconductor substrate 21 consists of n-type GaAs, a collector layer 22 consists of n-type GaAs, a first barrier layer 23 consists of AlAs, a second barrier layer 25 consists of AlAs, and an emitter layer 26 consists of n-type GaAs having an Si doping concentration of $5\times 10^{17}$ cm$^{-3}$. A base layer 24 is constituted by GaAs quantum well thin layers 24a, 24b, and 24c and AlAs intermediate barrier layers 41a and 41b which are sandwiched by these quantum well thin layers.

The above stacked structure is formed by sequentially growing the layers on the n-type GaAs substrate 21 by a normal molecular beam epitaxial growing method as in the above embodiments. A base electrode 29, an emitter electrode 28, and a collector electrode 27 are formed by a normal GaAs process technique.

In this case, in each of the quantum well thin films 24a, 24b, and 24c, Be serving as a p-type impurity is planar-doped at a dose of $1\times 10^{13}$ cm$^{-2}$ such that growing of GaAs is temporarily stopped at its center portion. In order to accurately control a quantum well width at with accuracy of a single molecular layer, the growth of each quantum well is stopped immediately before and after each quantum well is grown, a heterointerface is planarized.

In the above structure, a voltage is applied to the base electrode 29 to simultaneously control all the potentials of the quantum well thin layers 24a, 24b, and 24c. Since the base region 24 is constituted by quantum-mechanically coupling the intermediate barrier layers 41a and 41b and three quantum well thin layers 24a, 24b, and 24c which are divided by the insertion of the intermediate barrier layers 41a and 41b, energy levels 33 and 34 causing resonant tunneling are determined as the total level of electrons in the base layer 24.

In this resonant tunneling transistor, a well width $L_2$ of the central quantum well thin layer 24b is smaller than a well width $L_3$ of the quantum well thin layer 24c located at one end of the transistor and than a well width $L_1$ of the quantum well thin layer 24c located at the other end of the transistor. In this embodiment, the well widths $L_1$ to $L_3$ satisfy conditions $L_1=L_3=22$ ML (ML: molecular layer) and $L_2=14$ ML; a thickness $L_7$ of the barrier layer 23 satisfies condition $L_7=7$ ML; a thickness $L_4$ of the barrier layer 25 satisfies condition $L_4=7$ ML; and thicknesses $L_5$ and $L_6$ of the inserted barrier layers 41a and 41b satisfy condition $L_5=L_6=3$ ML.

Figure 20:
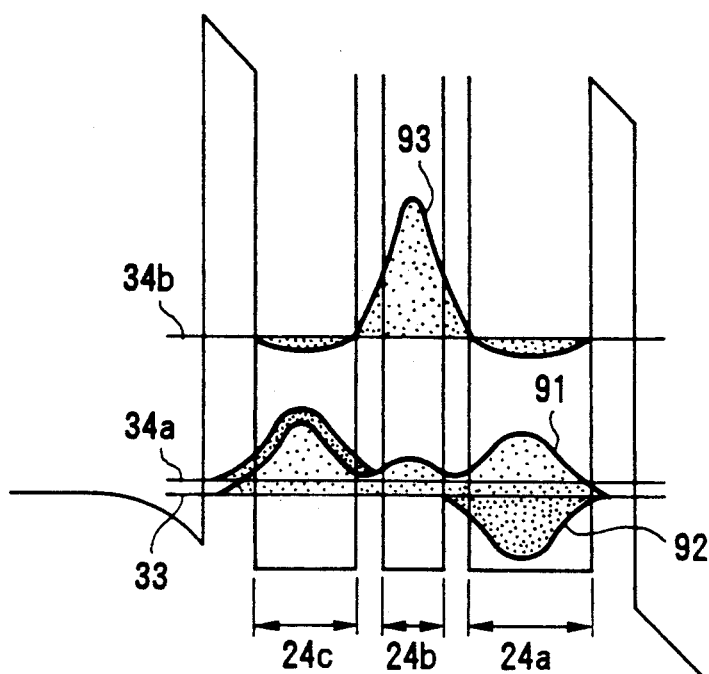
FIG. 20 is a view showing a wave function of electrons corresponding to the energy level in the embodiment of FIG. 18.

FIG. 20 shows electron wave functions 91, 92, and 93 respectively corresponding to the energy levels of a ground-state energy level 33, a first excited-state level 34a, and a second excited-state level 34b of electrons in the base layer 24. Since the quantum well widths are determined as described above, amplitudes of the wave functions 91 and 92 respectively corresponding to the ground-state energy level 33 and the first excited-state level 34a are large in the quantum well thin layers 24a and 24c located at both the ends of the base layer 24. This means that electrons are concentrated in the wells at both the ends of the base layer 24. The amplitude of the wave function 93 corresponding to the second excited-state level 34b is large in the central quantum well thin film 24b, and this means that electrons are concentrated in the well of the quantum well thin layer 24b. The characteristic features of the wave functions essentially result from a basic law of quantum mechanics for the coupled quantum well structure. That is, according to this basic low, a wave having a large wavelength has a low energy, and wave functions at the respective levels are orthogonal to each other. These characteristics of the wave functions can be obtained not only when the film thicknesses are set as described above but when the width of the quantum well thin film 24b is smaller than those of the quantum well thin layers 24a and 24c.

Figure 21:
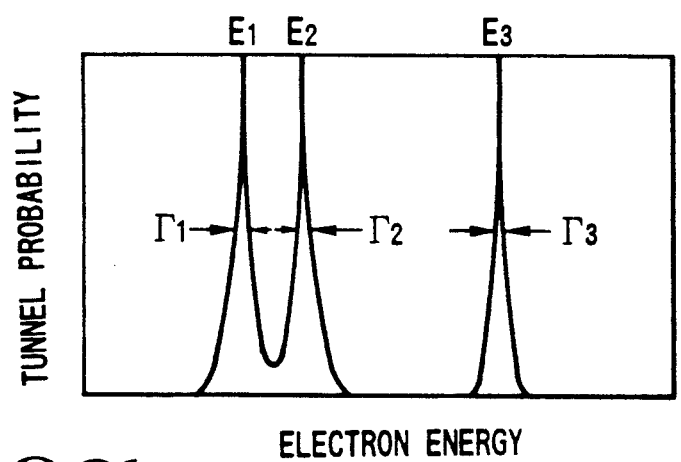
FIG. 21 is a graph showing a tunneling transmission probability with respect to a coupled quantum well structure in the embodiment of FIG. 18.

FIG. 21 shows a tunneling transmission probability for the coupled quantum well structure. The peak energy values of the transmission probability are $E_1=88$ meV, $E_2=93$ meV, and $E_3=181$ meV. The coupled quantum well structure has the following characteristics. That is, the half-widths ($\Gamma_1$, $\Gamma_2$) of resonant tunneling probabilities obtained through the ground-state energy level and the first excited-state level are larger than that of the half-width ($\Gamma_3$) of a resonant tunneling probability obtained through the second excited-state level. This is directly associated with the nature of the wave functions as described above. That is, the half-width of the resonant tunneling probability depends on the escapablility of electrons at the corresponding level from the coupled quantum wells by tunneling. In the conventional single quantum well structure, since the height of a barrier is increased in proportion to an increase in energy of a level, electrons easily escape from the quantum well, and a half-width is increased. In contrast to this, in the coupled quantum well structure, as shown in FIG. 20, although the energy of the second excited-state level 34b is higher than those of the ground-state energy level 33 and the first excited-state level 34a, electrons are concentrated in at the central quantum well thin layer 24b. For this reason, an effect of an increase in apparent thickness of the barrier is enhanced, and electrons do not easily escape by tunneling. As a result, the half-width corresponding to the second excited-state level 34b becomes smaller than the values corresponding to the ground-state energy level 33 and the first excited-state level 34a.

Figure 22:
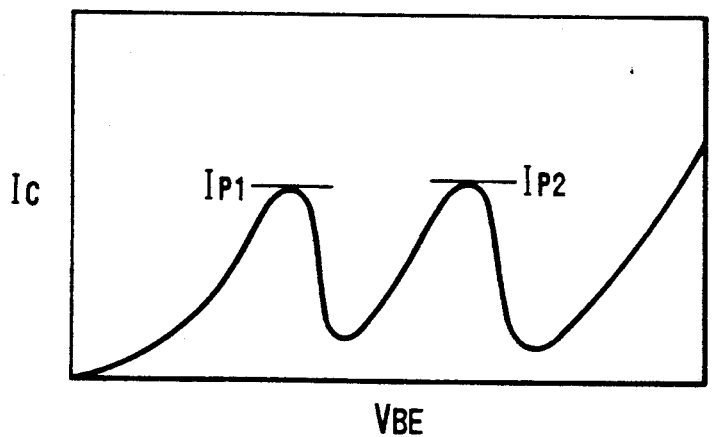
FIG. 22 is a graph showing current-voltage characteristics obtained in the embodiment of FIG. 18.

Since the transmission probability has the above relationships between the half-widths, substantially equal peak current values which are difficult to be obtained in a conventional structure can be obtained in current-voltage characteristics. FIG. 22 shows the resultant current-voltage characteristics. Since the difference between a peak energy value $E_1$ and a peak energy value $E_2$ is smaller than the value of the Fermi level (about 30 meV) of the emitter, these peak values overlap each other as one peak $I_{P1}$ shown in FIG. 22. In addition, in this embodiment, resonant tunneling current peaks $I_{P1}$ and $I_{P2}$ are substantially equal to each other to be $4 \times 10^3$ A/cm². The characteristics are considerably improved compared with peaks satisfying condition $I_{P1} < < I_{P2}$ in a conventional structure.

An interval between the resonant tunneling current peaks $I_{P1}$ and $I_{P2}$ can be adjusted by changing a quantum well width. For example, the well widths of both the ends of the base layer are constant, and the central well width is further decreased, thereby increasing a bias voltage corresponding to the resonant tunneling current peak $I_{P2}$. This is because the energy value of the second excited-state level 34b is increased. In addition, when the central well width is constant, and the well widths of both the ends of the base layer are increased, the energies of the ground-state energy level 33 and the first excited-state level 34a are decreased, and a bias voltage for supplying the resonant tunneling current peak $I_{P1}$ is decreased.

The above effect is obtained in a case wherein three quantum wells are coupled to each other. However, even when four or more quantum wells are coupled to each other, when the well widths of both the ends of a base layer are increased, it is apparent that the same effect as described above and substantially equal current peaks can be obtained.

Figure 23:
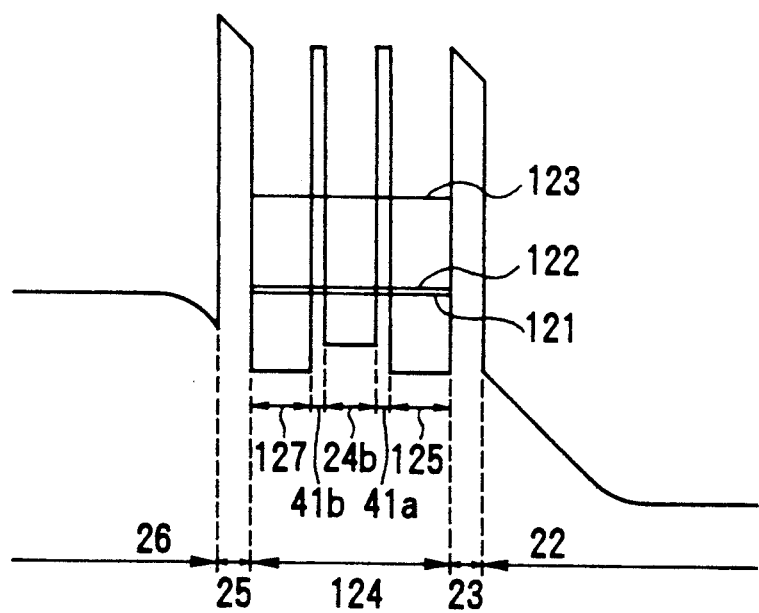
FIG. 23 is a view showing only a conduction band minimum of a band structure in a an element structure in the fifth embodiment of the present invention.

FIG. 23 is a view for explaining an arrangement according to the fifth embodiment of the present invention. The entire structure of a resonant tunneling transistor according to this embodiment is similar to that of the resonant tunneling transistor shown in FIGS. 18 and 19 except for a base layer. This embodiment is characterized by the structure of the base layer. FIG. 23 shows only a conduction band minimum of a band structure in the resonant tunneling transistor according to the present invention, and FIG. 23 shows a case wherein a bias voltage $V_{BE}$ close to a voltage in an operative state is applied across the emitter and base of the transistor.

A base layer 24 characterized in FIG. 23 is constituted by $In_xGa_{1-x}As$ quantum well layers (x=0.025) 125 and 127, a GaAs quantum well thin layer 24b, and AlAs intermediate barrier layers 41a and 41b. Reference numerals 121, 122, and 123 denote the ground-state energy level, the first excited-state level, and the second excited-state level of electrons in the base layer 124, respectively. An Si doping concentration of an n-type GaAs emitter layer 26 is set to be $5 \times 10^{17}$ cm$^{-3}$.

This stacked structure is grown by the same method as described in the above embodiments.

In this embodiment, well widths $L_3$ and $L_1$ of the quantum well thin layers 125 and 127 located at both the ends of the base layer and a well width $L_2$ of a central quantum well thin layer 24b are set to be equal to each other. In this embodiment, the well widths $L_1$ to $L_3$ satisfy condition $L_1=L_2=L_3=18$ ML (ML: molecular layer); a thickness $L_7$ of a barrier layer 23 satisfies condition $L_7=7$ ML; a thickness $L_4$ of a barrier layer 25 satisfies condition $L_4=7$ ML; and thicknesses $L_5$ and $L_6$ of the inserted barrier layers 41a and 41b satisfy condition $L_5=L_6=3$ ML.

Figure 18:
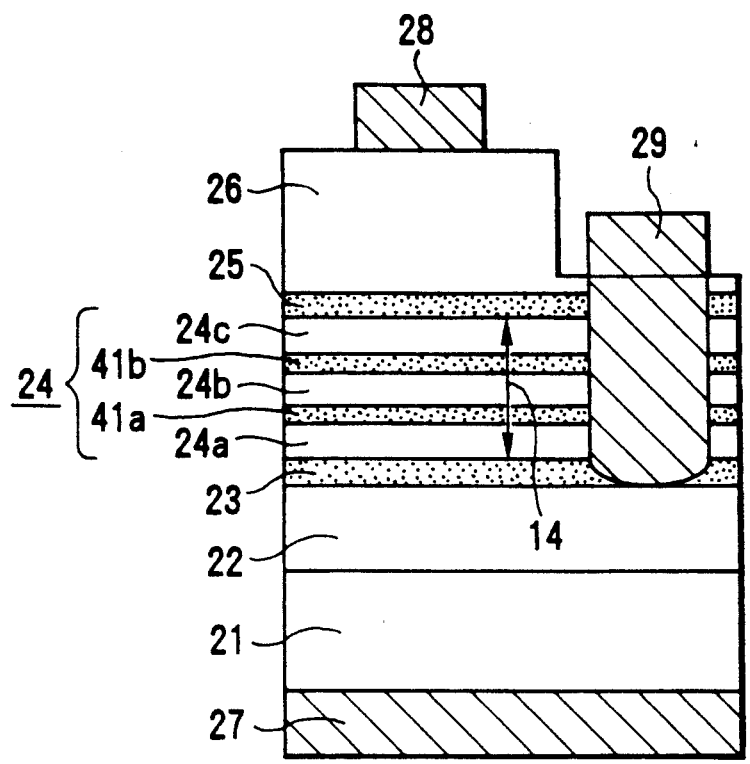
FIG. 18 is a view showing an arrangement of a resonant tunneling transistor according to the fourth embodiment of the present invention.
Figure 19:
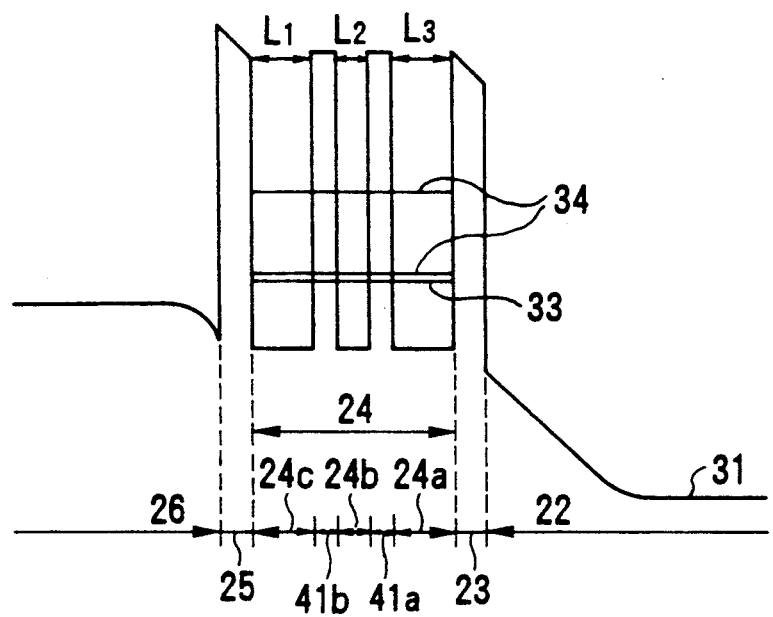
FIG. 19 is a view showing only a conduction band minimum of a band structure in the embodiment of FIG. 18.

In this embodiment, as in the embodiment in FIGS. 18 and 19, of wave functions of electrons corresponding to the energy levels such as the ground-state energy level, the first excited-state level, and the second excited-state level, the amplitudes of the wave functions corresponding to the ground-state energy level and the first excited-state level are large in the quantum well thin layers 125 and 127, and electrons are concentrated in the wells of both the ends of the base layer. In contrast to this, the amplitude of the wave function corresponding to the second excited-state level is large in the well of the central quantum well thin layer 24b, and electrons are concentrated in this well. The characteristic features of the wave functions essentially result from a basic low of quantum mechanics for the coupled quantum well structure. According to this basic low, wave functions at the respective levels are orthogonal to each other.

As a result, as in the embodiment shown in FIGS. 18 and 19, the peak energy values of the transmission probability are $E_1 = 90$ meV, $E_2 = 102$ meV, and $E_3 = 141$ meV. The half-widths ($\Gamma_1$, $\Gamma_2$) of resonant tunneling probabilities obtained through a ground-state energy level 33 and a first excited-state level 34a are larger than that of the half-width ($\Gamma_3$) of a resonant tunneling probability obtained through a second excited-state level 34b.

The peak energy values $E_1$, $E_2$, and $E_3$ of the transmission probability can be controlled by adjusting well widths and an In composition ratio as in the above embodiment in FIGS. 18 and 19.

Since the transmission probability has the above relationships between the half-widths, substantially equal peak current values which are difficult to be obtained in a conventional structure can be obtained in current-voltage characteristics. Since a difference between the peak energy value $E_1$ and the peak energy value $E_2$ is smaller than the value of the Fermi level (about 30 meV) of the emitter, these peak values overlap each other to be one peak. In this embodiment, resonant tunneling current peaks $I_{P1}$ and $I_{P2}$ are $5 \times 10^3$ A/cm$^2$. Although peaks satisfying condition $I_{P1} << I_{P2}$ are obtained in a conventional structure, the resonant tunneling current peaks $I_{P1}$ and $I_{P2}$ can be equal to each other in this embodiment.

Even when the embodiment in FIGS. 18 and 19 is combined with the embodiment in FIG. 23, and a change in quantum well width and a change in material used for the quantum wells are simultaneously performed, the same effect as described above can be obtained, and a degree of freedom of design of coupled quantum wells is further increased.

In the embodiments in FIGS. 18, 19 and 23, a case wherein the three coupled quantum wells are used is exemplified. However, even when four or more coupled quantum wells are used, the above description is apparently satisfied.

A difference in electron affinity is taken into consideration as an effect obtained by changing a material for a well in the embodiment of FIG. 23. However, the same effect as described above can be apparently obtained by a combination of materials having different effective masses such as a combination of GaAs and GaSb.

As described above, according to the embodiments shown in FIGS. 18 to 23, when the well widths and material of quantum wells to be coupled are appropriately selected for quantum wells to be coupled, although a proportional relationship between the energy of a resonance level and a resonant tunneling probability peak width corresponding to the energy, which was generally defined in a single quantum well, can be artificially modified by using the fact that the wave state of electrons in a resonance state can be controlled. As a result, even in resonant tunneling through an excited-state level, when a portion having a large amplitude of an electron wave is spaced apart from a barrier layer, a resonant tunneling probability peak width can be decreased, and a resonant tunneling current having a magnitude substantially equal to that of a resonant tunneling current flowing through a ground state can be obtained even in a three-terminal element structure. In addition, when a resonant tunneling transistor according to the present invention is used, since the number of elements in a functional circuit having a function such as a parity generating circuit, a multi-value logical circuit, a multi-value memory circuit, and an A/D converting circuit can be considerably decreased compared with the number of elements in a conventional functional circuit. Therefore, a high-speed operation and a high integration density can be advantageously obtained.

What is claimed is:

1. A resonant tunneling transistor comprising:
   a first semiconductor layer having an n-type conductivity and serving as a collector layer;
   a second semiconductor layer having a p-type conductivity having a thickness capable of generating discrete energy levels for either of electrons and holes in said second semiconductor layer and serving as a base layer;
   a third semiconductor layer having the n-type conductivity and serving as an emitter layer;
   a fourth semiconductor layer serving as a first barrier layer against either of electrons and holes in said first and second semiconductor layers;
   a fifth semiconductor layer serving as a second barrier layer against either of electrons and holes in said second and third semiconductor layers,
   wherein said first, second, third, fourth and fifth semiconductor layers are sequentially stacked in an order of said first, fourth, second, fifth, and third semiconductor layers,
   said second semiconductor layer sandwiches a sixth semiconductor layer serving as a third barrier against either of electrons and holes, thereby dividing said second semiconductor layer into a plurality of semiconductor layer portions and
   said sixth semiconductor layer has a thickness capable of quantum-mechanically bonding said semiconductor layer portions to each other, thereby being capable of modifying said discrete energy levels in said second semiconductor layer.

2. A transistor according to claim 1, wherein a thickness of said sixth semiconductor layer is set to be larger than a thickness of each of said semiconductor layer portions in which a ground-state energy level of light holes in each of said semiconductor layer portions of said second semiconductor layer is equal to a Fermi level of said semiconductor layer portions.

3. A transistor according to claim 1, wherein said second semiconductor layer includes a planar doped layer.

4. A transistor according to claim 1, wherein a forbidden band width of said first semiconductor layer is larger than a forbidden band width of said second semiconductor layer, a thickness of each of said semiconductor layer portions of said second semiconductor layer is smaller than a thickness given when a ground-state energy level of electrons in each of said semiconductor layer portions is equal to a conduction band minimum of said first semiconductor layer.

5. A transistor according to claim 1, wherein said sixth semiconductor layer comprises at least two layers, and said second semiconductor layer is divided into at least three quantum wells.

6. A transistor according to claim 5, wherein, of said semiconductor layer portions of said second semiconductor layer, a thickness of each of said semiconductor layer portions adjacent to said fourth and fifth semiconductor layers is larger than that of at least one of remaining semiconductor layer portions.

7. A transistor according to claim 5, wherein, of said semiconductor layer portions of said second semiconductor layer, an electron affinity of each of said semiconductor layer portions adjacent to said fourth and fifth semiconductor layers is larger than an electron affinity of at least one of remaining semiconductor layer portions.

8. A transistor according to claim 5, wherein, of said semiconductor layer portions of said second semiconductor layer, an electron effective mass of each of said semiconductor layer portions adjacent to said fourth and fifth semiconductor layers is larger than an electron effective mass of at least one of remaining semiconductor layer portions.

9. A transistor according to claim 1, wherein each of said semiconductor layer portions of said second semiconductor layer has an impurity concentration which is gradually decreased from a central portion to a peripheral portion in a direction of thickness.

10. A resonant tunneling transistor comprising:
a first semiconductor layer having an n-type conductivity and serving as a collector layer;
a second semiconductor layer having a p-type conductivity and serving as a base layer;
a third semiconductor layer having the n-type conductivity and serving as an emitter layer;
a fourth semiconductor layer serving as a first barrier layer against either of electrons and holes in said first and second semiconductor layers;
a fifth semiconductor layer serving as a second barrier layer against either of electrons and holes in said second and third semiconductor layers,
wherein said first, second, third, fourth and fifth semiconductor layers are sequentially stacked in an order of said first, fourth, second, fifth, and third semiconductor layers, and
said second semiconductor layer sandwiches a sixth semiconductor layer serving as a third barrier against either of electrons and holes, thereby dividing said second semiconductor layer into a plurality of semiconductor layer portions each having an impurity concentration which is gradually decreased from a central portion to a peripheral portion in a direction of thickness.

* * * * *